(12) United States Patent
Marszal et al.

(10) Patent No.: US 6,391,115 B1
(45) Date of Patent: May 21, 2002

(54) UNDERPLATFORM COATING TOOL

(75) Inventors: Dean N. Marszal, Southington; Merritt W. Wight, East Hartford; Ryan J. Kelly, Rocky Hill, all of CT (US)

(73) Assignee: United Technologies Corporation, Hartford, CT (US)

( * ) Notice: Subject to any disclaimer, the term of this patent is extended or adjusted under 35 U.S.C. 154(b) by 86 days.

(21) Appl. No.: 09/685,806

(22) Filed: Oct. 10, 2000

(51) Int. Cl.$^7$ ............................................. C23C 16/04
(52) U.S. Cl. ...................... 118/721; 118/500; 118/504; 118/505
(58) Field of Search ................ 118/720, 721, 118/500, 504, 505; 427/282; 204/298.15; 269/287, 288

(56) References Cited

U.S. PATENT DOCUMENTS

| | | | | |
|---|---|---|---|---|
| 4,271,005 A | * | 6/1981 | Wright et al. ............... | 118/728 |
| 5,792,267 A | * | 8/1998 | Marszal et al. ............. | 118/500 |
| 5,849,359 A | * | 12/1998 | Burns et al. ................ | 427/242 |
| 6,296,705 B1 | * | 10/2001 | Ireland et al. .............. | 118/505 |
| 6,332,926 B1 | * | 12/2001 | Pfaendtner et al. ......... | 118/721 |

* cited by examiner

*Primary Examiner*—Laura Edwards
(74) *Attorney, Agent, or Firm*—Bachman & LaPointe, P.C.

(57) ABSTRACT

The present invention relates to an improved tool for holding at least one turbine blade having a platform during the application of a coating to underplatform areas of the at least one turbine blade. The tool includes at least one fixture for holding the at least one turbine bladed during the coating application. The at least one fixture has a base receptacle for receiving the at least one turbine blade and a cover for the base receptacle. Each of the base receptacle and the cover has an opening which corresponds in shape to each of the underplatform areas to be coated.

13 Claims, 5 Drawing Sheets

UNDERPLATFORM COATING TOOL

BACKGROUND OF THE INVENTION

The present invention relates to a tool for holding one or more turbine blades during the application of a cathodic arc coating to the underplatform area of the turbine blade(s).

Jet engine turbine blades work in a difficult, corrosive environment and are subject to extremes of temperature. As a result, portions of the blade need to be coated to counter the effects of corrosion and heat such as pitting. One of those portions is the underplatform area of the turbine blade.

Cathodic arc coating and other techniques have been used to apply various coatings, such as platinum-aluminide coatings, to various turbine blade portions. However, conventional tooling to mask root and airfoil portions of the blade allowed too much coating to deposit on the tool itself. As a result, access to the underplatform areas to be coated became limited.

Thus, there is a need for improved tooling for use in the coating of underplatform areas of a turbine blade.

SUMMARY OF THE INVENTION

Accordingly, it is an object of the present invention to provide an improved tool for use in an underplatform coating operation.

It is a further object of the present invention to provide a tool as above which is compatible with standard cathodic arc coating apparatus.

It is yet a further object of the present invention to provide a tool as above which has specifically configured openings to allow coating deposition only in those underplatform areas where coating is required.

It is still a further object of the prevent invention to provide a tool as above which is easy to assemble and which can be used more than once.

The foregoing objects are attained by the tool of the present invention.

In accordance with the present invention, a tool for holding at least one turbine blade having a platform during the application of a coating to underplatform areas of the at least one turbine blade is provided. The tool comprises one or more fixtures for holding one or more turbine blades during the coating application. Each fixture comprises a base receptacle for receiving a turbine blade and a cover for the base receptacle. Each of the base receptacle and the cover have an opening which corresponds in shape to one of the underplatform areas to be coated. In one embodiment, the tool of the present invention has two fixtures joined together to permit simultaneous coating of the underplatform areas of two turbine blades.

Other details of the tool of the present invention, as well as other objects and advantages attendant thereto, are set forth in the following detailed description and the accompanying drawings, wherein like reference numerals depict like elements.

DETAILED DESCRIPTION OF THE PREFERRED EMBODIMENT(S)

Figure 1:
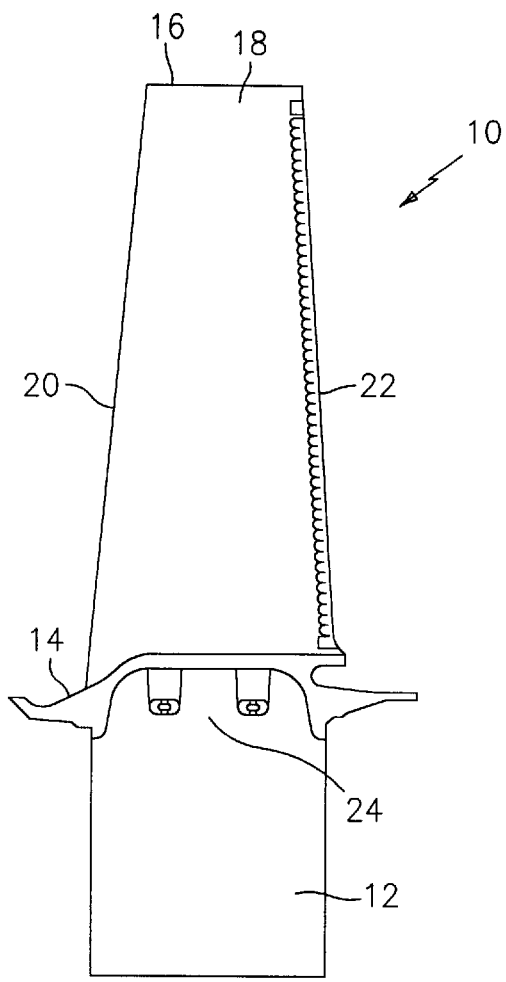
FIG. 1 is a side view of a turbine blade to be coated.

Referring now to the drawings, FIG. 1 illustrates a turbine blade 10 to be coated. The turbine blade 10 has a root portion 12, a platform 14, a tip portion 16, and an airfoil portion 18 with a leading edge 20 and a trailing edge 22. In this type of turbine blade, it is desirable to coat a portion of the turbine blade 10 beneath the platform 14, known as the underplatform area 24, on each side of the turbine blade 10. The size and shape of the underplatform area to be coated will vary from turbine blade to turbine blade.

Figure 2:
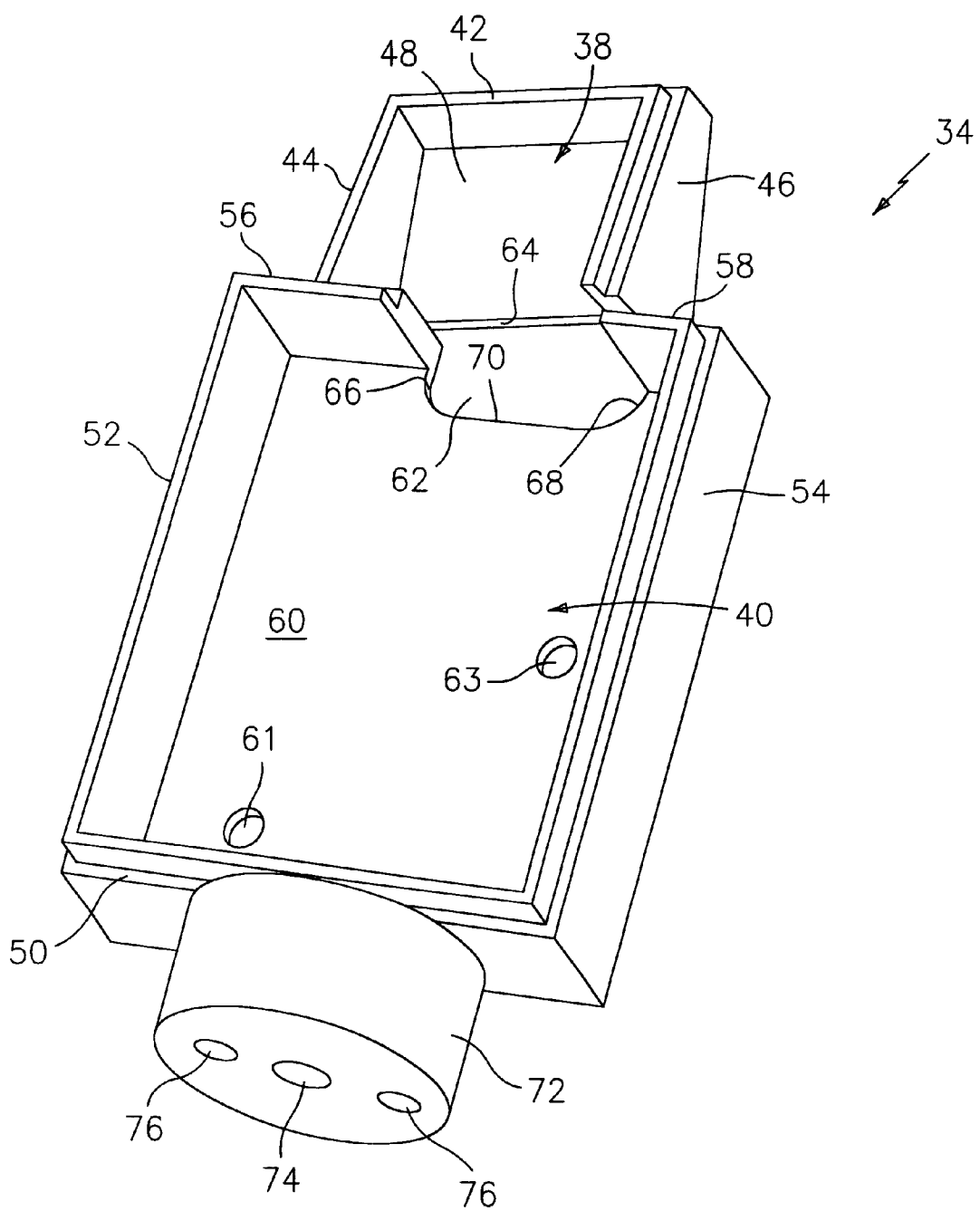
FIG. 2 is a top view of a base receptacle portion of a tool to be used to hold a turbine blade whose underplatform areas are to be coated.
Figure 3:
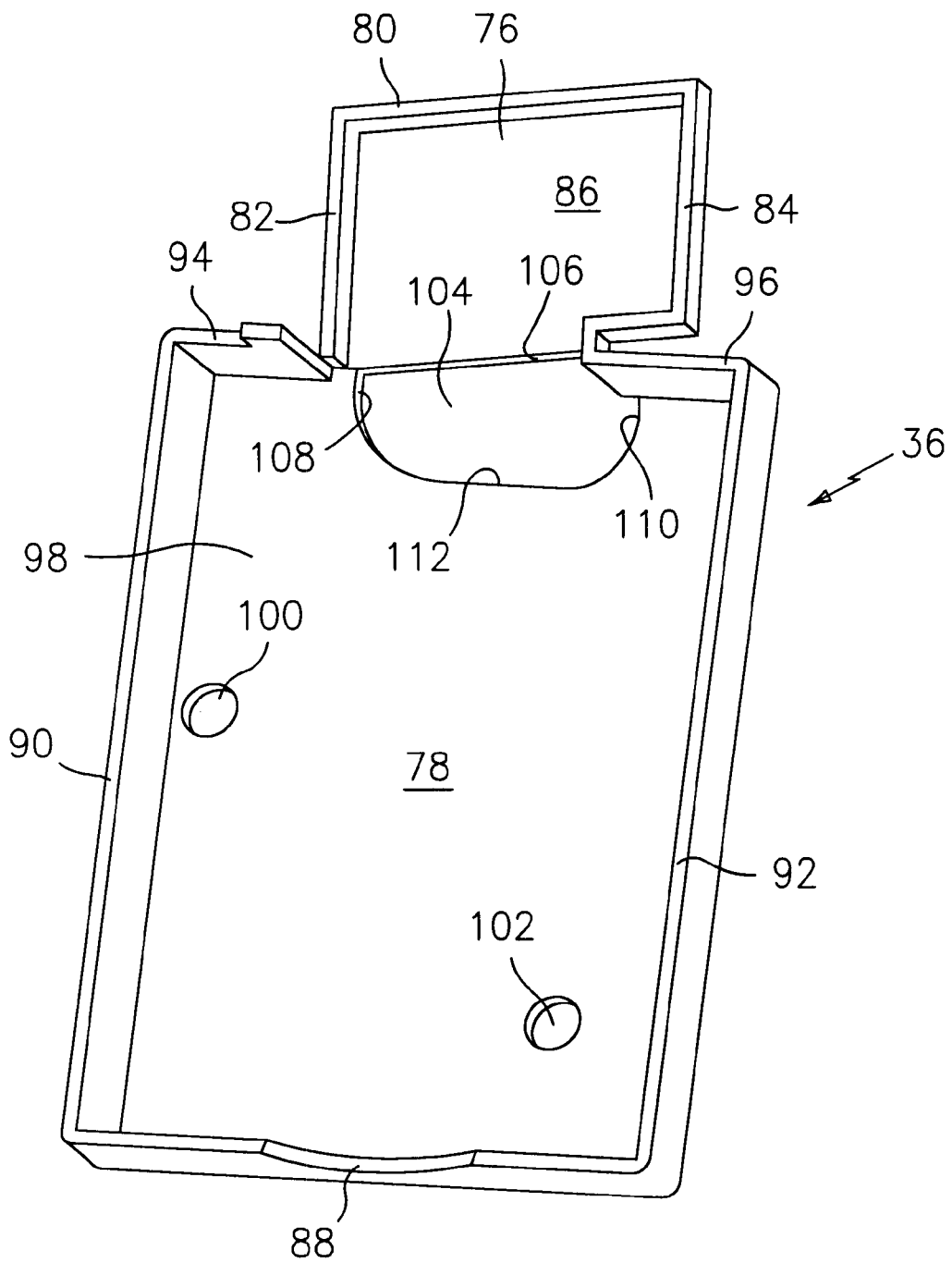
FIG. 3 is a bottom view of a cover for the tool of the present invention.

Referring now to FIGS. 2 and 3, the components of a tool 30 for holding a turbine blade whose during the application of the coating to the underplatform areas is illustrated. As shown therein, the tool 30 comprises at least one fixture 32 which includes a base receptacle 34 for receiving a turbine blade and a cover 36 for the base receptacle.

The base receptacle 34 has two sections 38 and 40. The first section 38 receives the root portion 12 of the turbine blade 10 and is formed by end wall 42, sidewalls 44 and 46, and back wall 48. The section 38 preferably has a depth which is substantially equal to the depth of the blade root portion 12 and a length substantially equal to the extent of the root portion 12. To accommodate angularity in the root portion 12, one of the sidewalls 46 and 48 may have a height greater than the other of the sidewalls 46 and 48.

The second section 40 of the base receptacle 34 is formed by end wall 50, sidewalls 52 and 54, partial end walls 56 and 58, and back wall 60. The back wall 60 is provided with apertures 61 and 63 whose purpose will be discussed hereinafter. The depth of the second section 40 may be equal to or less than the depth of the turbine blade whose underplatform areas are to be coated. The length of the second section 40 is substantially equal to the length of the turbine blade from the underside of the platform 14 to the tip portion 16 so that when the turbine blade 10 is positioned within the base receptacle 34, the tip portion 16 contacts the end wall 50 and the underside of a portion of the platform 14 contacts the partial end walls 56 and 58. The width of the section 40 preferably corresponds to the extent of the platform 14 of the turbine blade 10 so that one edge of the platform 14 contacts the sidewall 52 and the other edge of the platform 14 contacts the sidewall 54.

The first section 38 may be joined to the second section 40 using any suitable technique known in the art. For example, the sidewalls 44 and 46 may be welded to the partial end walls 56 and 58 respectively. If desired, the first section 38 may be integrally formed with the second section 40.

As shown in FIG. 2, an opening 62 is provided in the base receptacle 34. The opening 62 corresponds in shape to the underplatform area 24 to be coated on one side of the turbine blade. As can be seen from this figure, the opening 62 is formed by a substantially linear portion 64 of the back wall 48 of the first section 38, two, generally non-linear, sidewall portions 66 and 68 formed in the back wall 60 of the second section 40, and a connecting wall portion 70, also formed in the back wall 60, which extends between and joins sidewall portion 66 to sidewall portion 68. The shape of the sidewall portions 66 and 68 and the connecting wall portion 70 are determined by the shape of the underplatform area to be coated. Different fixtures 32 may have openings 62 with different shapes.

When used in a coating operation, the fixture 32 is mounted or attached to a portion of a coating machine for rotation or oscillation about the longitudinal axis of the turbine blade. To allow the fixture 32 to be mounted to the coating machine, a disk 72 is affixed, such as by welding, to the end wall 50. The disk has a central bore 74 for receiving a drive element of the coating machine and at least one other bore 76 for receiving a stabilizing member or an additional drive element associated with the coating machine.

Referring now to FIG. 3, the cover 36 also has first and second sections 76 and 78 respectively which preferably correspond in shape and size to the sections 38 and 40. The first section 76 includes an end wall 80, sidewalls 82 and 84, and cover wall 86. The second section 78 includes an end wall 88, two sidewalls 90 and 92, partial end walls 94 and 96, and a cover wall 98. The cover wall 98 has two apertures 100 and 102 therein which, when the cover 36 is placed over the base receptacle 34, are aligned with the apertures 61 and 63 to enable bolts or other fastening devices to be passed therethrough for joining the cover 36 to the base receptacle 34.

The first cover section 76 may be joined to the second cover section 78 in any suitable manner known in the art. For example, the sidewalls 82 and 84 may be welded to the partial end walls 94 and 96. Depending upon the angularity of the root portion of the turbine blade and/or the angularity of the sidewalls 44 and 46 of the base receptacle 34, the first cover section 76 may be angled with respect to the second cover section 78.

As shown in FIG. 3, the cover 36 also has an opening 104 for allowing a coating material to coat the underplatform area 24 of a second side of the turbine blade. The opening 104 is formed by a linear portion 106 of the cover wall 86, two, generally non-linear, sidewall portions 108 and 110, and a connecting portion 112 which extends between and joins the sidewall portions 108 and 110. The shape of the opening 104 corresponds to the shape of the underplatform area to be coated.

The base receptacle 34 and the cover 36 may be formed from any suitable material known in the art, preferably a metallic material.

Figure 4:
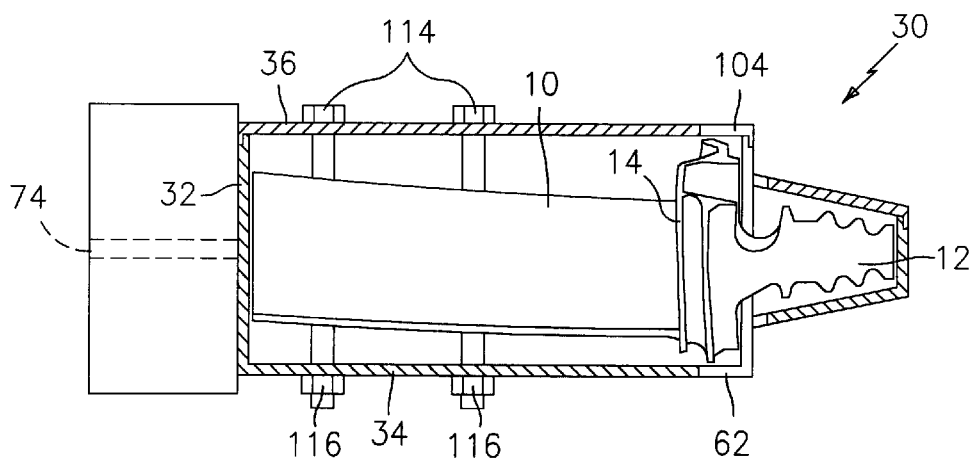
FIG. 4 is a sectional view of the tool of the present invention in an assembled configuration.

FIG. 4 shows a turbine blade 10, whose underplatform areas 24 are to be coated, seated within the base receptacle 34 and the cover 36 positioned over the base receptacle 34 and affixed thereto by bolts 114 and nuts 116. While bolts and nuts are preferably used to affix the cover 36 to the base receptacle 34, any other suitable fastening means known in the art may be used to join the base receptacle 34 to the cover 36.

Figure 5:
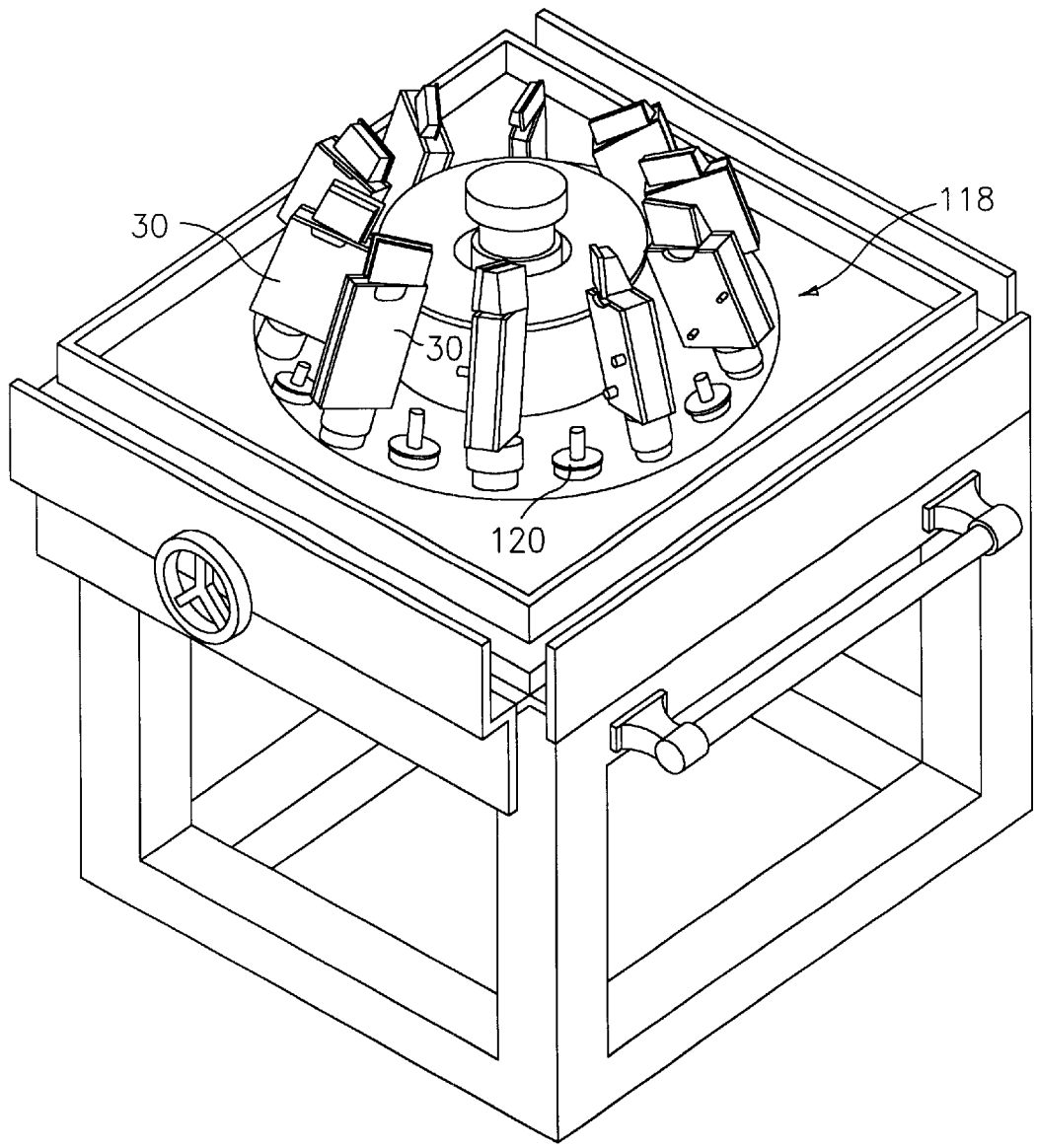
FIG. 5 is a perspective view showing a plurality of tools in accordance with the present invention positioned on a coating apparatus.

Referring now to FIG. 5, there is shown a plurality of the tools 30 positioned on a cathodic arc coater 118. The coater 118 may comprise any suitable cathodic arc coater known in the art. As shown in the figure, the coater 118 preferably has a plurality of oscillatable or rotatable mounting elements 120 onto which the tools 30 are loaded. The mounting elements 120 are arranged so that one side of the tool and one of the openings 62 and 104 is initially angularly disposed towards the coater and the coating material, preferably by an angle of about 25 degrees with respect to a vertical axis. This moves the underplatform areas to be coated closer to the coating vapors. During coating, the mounting elements 120 oscillate or rotate so as to expose the other side of the tool and the other of the openings 62 and 104 towards the coater and the coating material. Since each turbine blade 10 is entirely encased within a tool 30, the only portions of the turbine blade 10 which are coated are the underplatform areas 24 adjacent the openings 62 and 104.

The coater 118 may be used to apply any desired coating to the underplatform areas. For example, a NiCrAlY coating may be applied to the underplatform areas.

Figure 6:
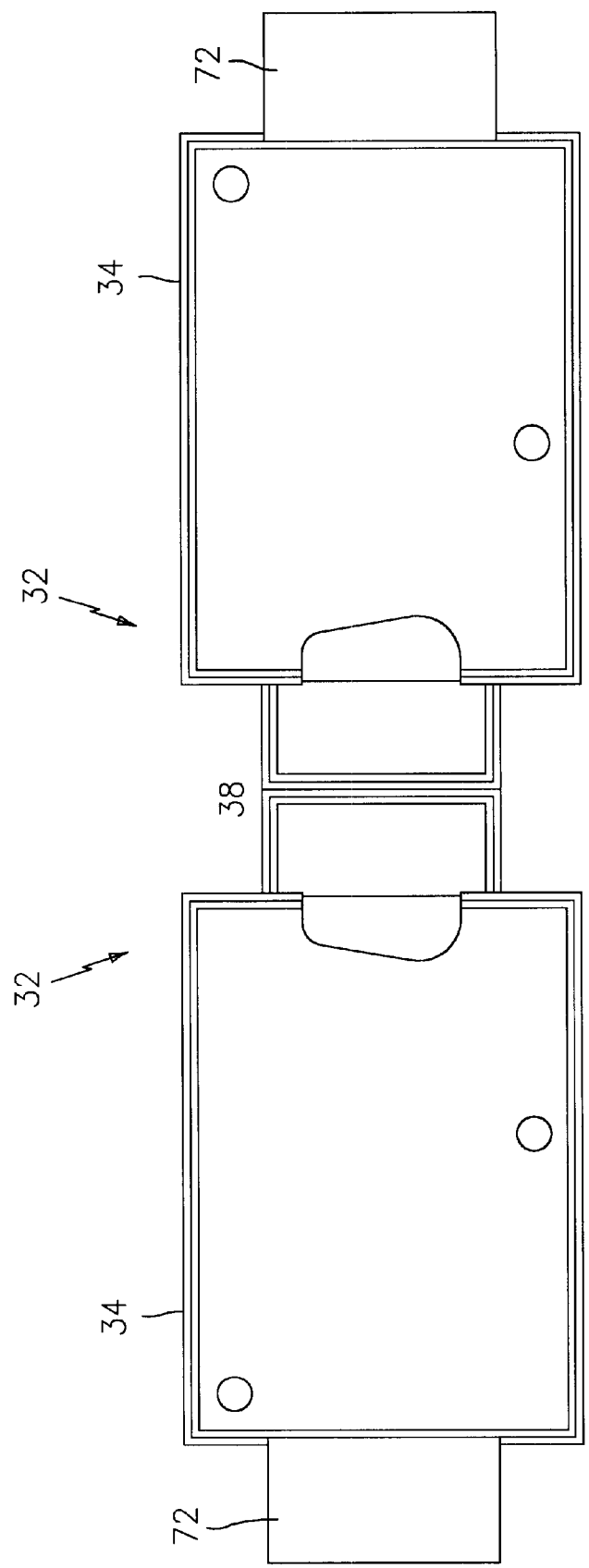
FIG. 6 is a cross sectional view of an alternative embodiment of the tool of the present invention having two fixtures joined together.

Referring now to FIG. 6, an alternative embodiment of a tool 30 in accordance with the present invention is provided. The tool 30 has two fixtures 32 joined end to end. The fixtures 32 may be joined together in any desired together such as by having the first sections 38 of the base receptacles 34 welded together as shown in the figure. The structure of the base receptacles 34 and the covers 36, which are to be positioned over the joined base receptacles, in this tool embodiment are identical in construction to the base receptacle and cover discussed above. While this tool embodiment has been shown with two disks 72, one of the disks may be omitted if it is not required.

There are a number of advantages to the tool of the present invention. For example, the tool allows an increase in productivity and a reduction in the coating the underplatform areas of a turbine blade. The tool is compatible with a wide range of cathodic arc coaters. Still further, the tool allows optimum orientation of the component to be coated to optimize deposition characteristics such as coating thickness and coating microstructure. It also maximizes access to the underplatform areas to be coated while preventing coating of the root portion. The tool also minimally interferes with the metal ion field and thus prevents shadowing.

The tools of the present invention may be used on multiple occasions and any coating formed on the outer surfaces of the tool may be removed using a chemical strip technique. If desired, the tool could be modified to incorporate disposable shielding to minimize the need for chemical strip operations.

It is apparent that there has been provided in accordance with the present invention an underplatform coating tool which fully satisfies the objects, means, and advantages set forth hereinbefore. While the present invention has been described in the context of specific embodiments thereof, other alternatives, modifications, and variations will become apparent to those skilled in the art having read the foregoing description. Therefore, it is intended to embrace those alternatives, modifications, and variations which fall within the broad scope of the appended claims.

What is claimed is:

1. A tool for holding at least one turbine blade having a platform during the application of a coating to underplatform areas of said at least one turbine blade, said tool comprising:

at least one fixture for holding said at least one turbine blade during said coating application;

said at least one fixture comprising a base receptacle for receiving said at least one turbine blade, a cover for said base receptacle, and means for joining said base receptacle and said cover together so that only said underplatform areas are exposed to a coating material; and each of said base receptacle and said cover having an opening which corresponds in shape to one of said underplatform areas to be coated.

2. A tool according to claim 1, wherein said base receptacle has a first section for receiving a root portion of said at least one turbine blade and a second section for receiving a second portion of said at least one turbine blade, and said opening being formed by a portion of said first second and portions of said second section.

3. A tool according to claim 2, wherein said opening is defined by a linear end portion of said first section, two non-linear sidewall portions formed in said second section, and a connecting portion formed in said second section joining said sidewall portions.

4. A tool according to claim 2, wherein said first section is welded to said second section.

5. A tool according to claim 2, wherein said first section has a depth which is substantially equal to the depth of said root portion.

6. A tool according to claim 2, wherein said cover has a first section which corresponds in shape and size to said first section of said base receptacle and a second section which corresponds in shape and size to said second section of said base receptacle.

7. A tool according to claim 6, wherein said opening in said cover is formed by a linear portion of said first section of said cover, two non-linear sidewall portions formed in the second section of said cover, and a connecting portion formed in the second section of said cover extending between and joining said sidewall portions.

8. A tool according to claim 1, wherein said joining means comprises at least one aperture in said base receptacle, at least one aligned aperture in said cover, at least one bolt which passes through said apertures in said cover and said base receptacle, and at least one nut threadingly engaged with said at least one bolt.

9. A tool according to claim 1, further comprising means for affixing said tool to a coating machine.

10. A tool according to claim 9, wherein said affixing means comprises a disk welded to an end wall of said second section of said base receptacle.

11. A fixture according to claim 10, wherein said disk has at least one bore for receiving at least one drive element of said coating machine which causes said fixture to move about an axis so as to expose said underplatform areas to a coating material.

12. A tool according to claim 1, further comprising two fixtures joined end to end to allow simultaneous coating of the underplatform areas of two turbine blades.

13. A tool according to claim 12, wherein said two fixtures have their respective base receptacles joined together along one edge.

* * * * *